United States Patent
Nishioka et al.

[11] Patent Number: 5,367,412
[45] Date of Patent: Nov. 22, 1994

[54] RECORDING/REPRODUCING CIRCUIT AND RECORDING/REPRODUCING APPARATUS HAVING THE SAME CIRCUIT

[75] Inventors: Kei Nishioka; Chung Chien San, both of Kyoto, Japan

[73] Assignee: Rohm Co., Ltd., Kyoto, Japan

[21] Appl. No.: 117,689

[22] Filed: Sep. 8, 1993

[30] Foreign Application Priority Data

Sep. 10, 1992 [JP] Japan .................. 4-266825

[51] Int. Cl.$^5$ .................. G11B 15/12; G11B 05/02
[52] U.S. Cl. .................. 360/67; 360/61
[58] Field of Search .................. 360/27, 46, 61, 62, 360/67, 68; 330/257, 259, 252, 51; 307/239

[56] References Cited

U.S. PATENT DOCUMENTS

| | | | |
|---|---|---|---|
| 3,454,893 | 9/1967 | Goordman | 307/239 |
| 4,724,060 | 6/1981 | Kawanabe | 330/51 X |
| 4,724,339 | 2/1988 | Ishida | 330/51 X |
| 4,724,397 | 2/1988 | Davis | 330/256 |
| 4,939,477 | 7/1980 | Itoh | 330/259 X |
| 5,150,073 | 9/1992 | Murari et al. | 330/260 X |

*Primary Examiner*—Donald Hajec
*Assistant Examiner*—Thien M. Le
*Attorney, Agent, or Firm*—Fay, Sharpe, Beall, Fagan, Minnich & McKee

[57] ABSTRACT

A recording/reproducing circuit according to the present invention comprises a recording amplifier for outputting a recording signal, a differential amplifier including a pair of transistors, a base of one of the transistors being a (+) side input, a base of the other transistor being a (−) side input, emitters of the transistors being connected commonly to a current source, the (+) side input being supplied with the recording signal, an output signal being fedback to the (−) side input, the output signal being sent to a recording head and means for cutting a current of the current source to thereby stop an outputting of the recording signal from the differential amplifier circuit.

7 Claims, 4 Drawing Sheets

RECORDING/REPRODUCING CIRCUIT AND RECORDING/REPRODUCING APPARATUS HAVING THE SAME CIRCUIT

DESCRIPTION

1. Technical Field

The present invention relates to a recording/reproducing circuit and a recording/reproducing apparatus having the same circuit and, particularly, to a recording/reproducing circuit for use in a recording/reproducing apparatus such as a radio cassette recorder equipped with a double cassette deck, which has the so-called dubbing function with which a reproducing operation for a signal can be performed while performing a recording operation for the same signal, which is featured by reduced number of switches to be mounted externally.

2. Background Art

FIG. 6 shows an example of a recording/reproducing circuit of a conventional radio cassette recorder having a double cassette deck including a first and second cassette decks. 1 depicts a reproducing head which may be provided on the second cassette deck, 2 and 3 reproducing amplifiers for amplifying a reproduced signal, 4 a bias trap for removing a bias signal component contained in the reproduced signal, 5 a Dolby circuit to be used as a noise reduction circuit, 6 a recording amplifier for amplifying an input signal and outputting it as a recording signal, 7a a selection line for activating the reproducing amplifier 2, 7b a selection line for activating the reproducing amplifier 3, 8 an ON/OFF switch for on/off controlling a line for supplying the recording signal to the head and 9 a recording/reproducing head provided on, for example, the first deck. 10 depicts a bias oscillator for generating an oscillation signal for bias-modulating the recording signal, 10a a switch which becomes "ON" during reproduction to apply a bias to the head 9 and 11 a switch for "ON/OFF" a reproduced signal line from the recording/reproducing head 9.

The selection lines 7a and 7b are for making one of the reproducing amplifiers 2 and 3 operable. When the first cassette deck is in a reproducing state, the selection line 7a becomes high level (referred to as "H", hereinafter) and, when the second cassette deck is in a reproducing state, the selection line 7b becomes "H", so that the respective reproducing amplifiers amplify and output a reproduced signal.

Although the second cassette deck of this recording/reproducing circuit, which includes the reproducing head 1, is for only reproduction, the first cassette deck including the recording/reproducing head 9 has not only the recording/reproducing function but also a dubbing function for recording a signal reproduced by the first deck.

When the first cassette deck is in a recording state, the switch 8 is "ON" and the switch 11 is "OFF". For example, a signal input from the external microphone 6a is modulated by the Dolby circuit 5 and amplified by the recording amplifier 6, resulting in a recording signal. This recording signal is passed to a high frequency range compensation circuit composed of R1, C2 and C3 and then passed through the switch 8 to the recording/reproducing head 9. The signal supplied to the head 9 is synthesized with an oscillation signal from the bias oscillator 10 and a resultant signal is magnetically recorded on the cassette tape through the head 9.

When the second cassette deck is in a reproducing state, the switches 8 and 11 are "OFF". The selection signal 7a becomes "L" and the selection signal 7b becomes "H", so that the reproducing amplifier 2 stops to operate and the reproducing amplifier 3 becomes operative. The recording signal magnetically recorded on the cassette tape is read out by the reproducing head 1 and added as a reproducing signal, to and amplified by the reproducing amplifier 3 through the capacitor C1. Incidentally, the capacitor C1 is a capacitor for attenuating high frequency range.

An output of the reproducing amplifier 3 is supplied through the bias trap 4 to the Dolby circuit 5. The bias trap 4 removes a bias signal component from the bias oscillator 10, which is mixed in due to going round in, etc. The reproduced signal is supplied through the Dolby circuit 5 and a preamplifier to an amplifier such as main amplifier and converted into a sound signal by the speaker 4a, etc., and output.

When the first cassette deck is in the reproducing state, the switch 8 is in the "OFF" state and the switch 11 is turned "ON". The selection signal 7a is "H" and the selection signal 7b becomes "L", the reproducing amplifier 3 stops to operate and the reproducing amplifier 2 becomes operable. The reproduced signal from the head 9 is supplied through the switch 11 to the reproducing amplifier 2. The operation subsequent to this stage is the same as mentioned previously.

In dubbing operation, the switch 8 of the first cassette deck is turned "ON" and the switch 11 is turned "OFF", the reproducing amplifier 3 becomes in an operable state and the reproducing amplifier 2 stops to operate. And, an output of the reproducing amplifier 3 is input through an attenuator, etc., provided in the Dolby circuit 5 to the recording amplifier 6. As a result, the reproduced signal by the head 1 is sent through the reproducing amplifier 3 and the recording amplifier 6 to the side of the head 9 and the reproduced signal of the head 1 is recorded.

In this case, a portion indicated by a chain line is usually takes in the form of an IC. However, the circuit portion outside it becomes external parts. The switches 8 and 11 are usually the so-called mechanical switches such as slide switches or lever switches.

The provision of the external switches 8 and 11 is to supply the reproduced signal from the reproducing head 1 and the reproduced signal from the recording/reproducing head to the single reproducing circuit system and, in the dubbing operation, to prevent the signal of the bias oscillator circuit connected to the recording/reproducing head and the recording signal from leaking to the reproduction side, that is, to prevent the so-called cross-talk.

In the IC type recording/reproducing circuit of this kind, in order to reduce the number of external switches, the output of the reproducing amplifier 3 is not connected through the switch circuit to the input of the recording amplifier 6 during the dubbing operation, but always connected by the attenuator, etc. Further, when a recording is performed by means of the Dolby system, the output of the reproducing amplifier 3 and the input of the recording amplifier 6 are connected through the Dolby circuit 5. Therefore, it is necessary to reliably separate the side of the head 9 from the recording/reproducing circuit. As a result, although the external switches 8 and 11, etc., become necessary, such switches tend to produce problems such as contact failure, etc.

SUMMARY OF THE INVENTION

An object of the present invention is to provide a recording/reproducing circuit which reduces switches to be externally provided in a recording circuit or a reproducing circuit and is suitable to be manufactured as an IC.

Another object of the present invention is to provide a recording/reproducing circuit which reduces switches to be externally provided in a recording/reproducing circuit for switching between a recording and a reproducing, is easy to assemble and is hardly subjected to failure such as contact failure.

In order to achieve these objects, a recording/reproducing circuit according to the present invention comprises a recording amplifier for outputting a recording signal; a differential amplifier circuit (referred to as differential amplifier, hereinafter) which includes a pair of transistors, one of the transistors having a base constituting a (+) side input (referred to as (+) input hereinafter), the other transistor having a base constituting a (−) side input (referred to as (−) input hereinafter) and the transistors having emitters connected commonly to a current source, the (+) input being supplied with the recording signal, an output signal of the differential amplifier being fedback to the (−) input and sent to a recording head; and means for blocking a current of the current source in order to stop a recording signal output of the differential amplifier.

In order to solve the conventional problems mentioned previously, it may be considered to make a switch circuit as an IC and to include it together with a recording/reproducing circuit in an IC. However, since, in the so-called transistor switch circuit which merely transmit or cut a signal by "ON/OFF" operation thereof, the switch circuit is formed on a single substrate on which other transistors are formed, a signal cutting performance thereof is not as good as those provided by mechanical switch or a discrete transistor switch. Particularly, since signal level of the recording signal is high, it tends to leak to other circuits.

Further, with a switch circuit within an IC, pop sound tends to be produced by its "ON/OFF" operation.

However, by providing the differential amplifier having construction as mentioned above and by cutting a current of the current source thereof, the recording signal can be cut sufficiently. For example, when the current source of the differential amplifier is connected to the side of a ground line, the commonly connected emitters of the differential transistors are separated from the ground line by cutting the current source. On the other hand, since the output side connected to a power source line is connected to the (−) input line by the feedback loop, the side of emitter on the (−) input side is connected to a high voltage power source line through its base and collector. As a result, the (−) input side transistor serves as a diode inserted in reverse direction with respect to the input signal by which the input side and the output side of the differential amplifier are substantially completely separated from each other.

When the current source is connected to the side of the power source line, the commonly connected emitters of the differential transistors are separated from the power source line by cutting the current source. On the other hand, since the output side connected to the ground line is connected to the (−) input line by the feedback loop, the floating emitter side of the transistor on the side of the (−) input is connected to the low voltage ground line through its base and collector. As a result, the transistor on the side of the (−) input serves as a forward connected diode. Thus, a connection circuit is formed by connecting the emitter side of the transistor on the side of the (+) input through the emitter of the transistor on the (−) input side to the ground line. Therefore, the base-emitter circuit of the transistor on the (+) input side serves as a reverse directed diode with respect to the input signal, separating the input side of the differential amplifier substantially completely from the output side thereof.

As a result, it is possible to sufficiently cut the recording signal from the recording amplifier without provision of switches externally of the IC.

DESCRIPTION OF THE PREFERRED EMBODIMENT

Figure 1:
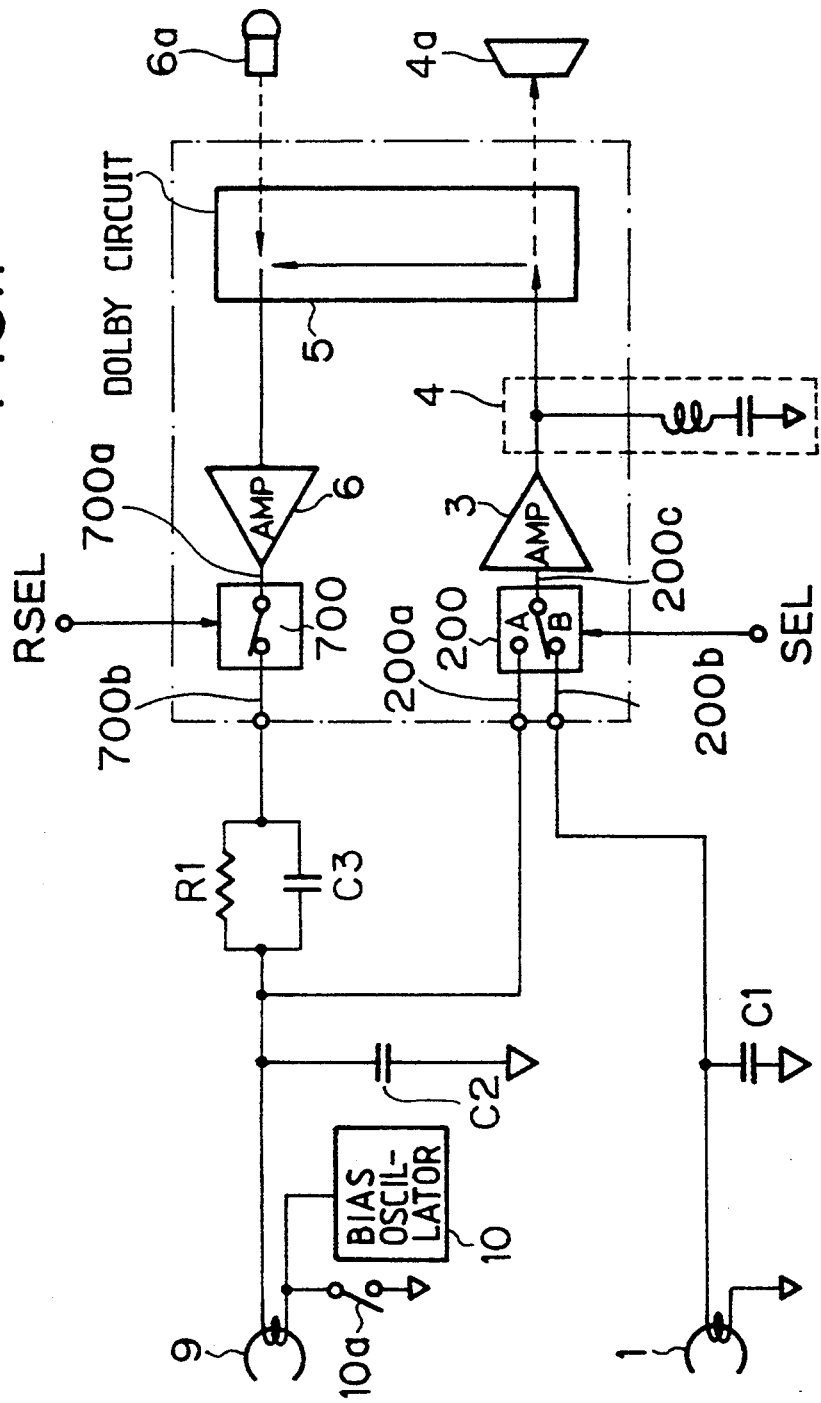
FIG. 1 is a block circuit diagram of an embodiment of a recording/reproducing circuit according to the present invention.
Figure 6:
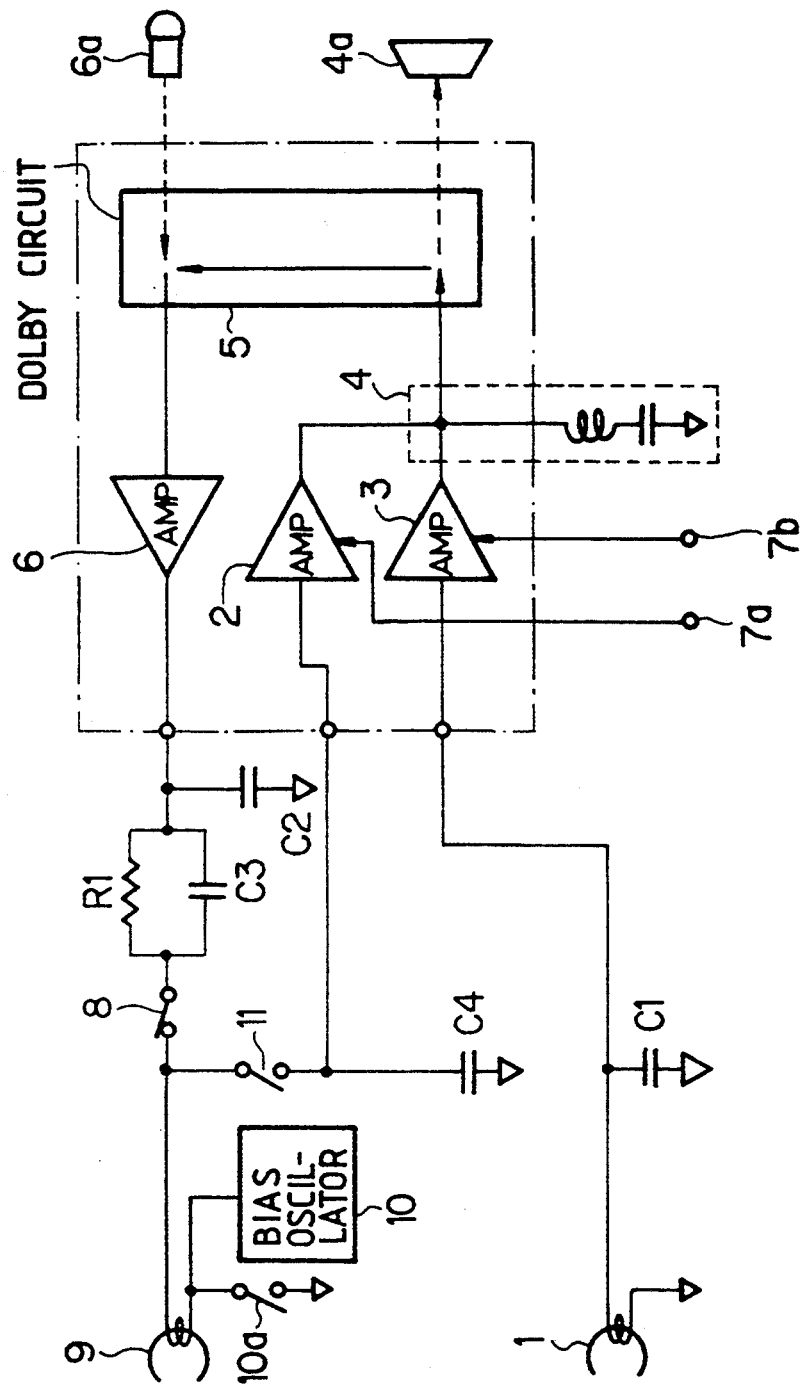
FIG. 6 is a block circuit diagram of an example of a conventional recording/reproducing circuit.

Differences of FIG. 1 from FIG. 6 are that the switches 8 and 11 in FIG. 6 are removed so that the wiring to the heads externally of the IC is performed without switches, that, instead of the switches, a switch circuit 700 is provided after the recording amplifier 6, that a turn-over switch circuit 200 is provided after the reproducing amplifier 3, the reproducing amplifier 2 is removed and that a high frequency compensating circuit composed of R1, C2 and C3 is provided on the side of the head 9. The switch circuits 700 and 200 are "ON/OFF" switched by turn-over signals generated within the respective switch circuits.

Since the same things as those in FIG. 6 are depicted by the same reference numerals, explanations thereof are omitted.

A recording setting signal RSEL is a signal generated during a recording or a dubbing operation and serving to turn the switch circuit 700 "ON". During a reproducing, this circuit is "OFF". A turn-over signal SEL uses either one of the selection lines 7a and 7b and, when, for example, it uses the selection line 7a, the switch circuit 200 is connected to the side of A if it is "H" and to the side of B if it is "L", so that a connection is selected to the side (A) of the head 9 or to the side (B) of the head 1 according to reproduction of the first cassette deck or the second cassette deck.

The switch circuits 700 and 200 are constituted as differential amplifiers, respectively, each to cut an input signal by cutting the current source commonly connected to the emitters of the pair of differential transistors.

The capacitor C2 of the high frequency compensating circuit provided on the side of the head 9 by-passes a high frequency, high voltage signal from the bias oscillator 10 to prevent it from being applied directly to the side of the switch circuit 200 during recording or dubbing operation.

Figure 2:
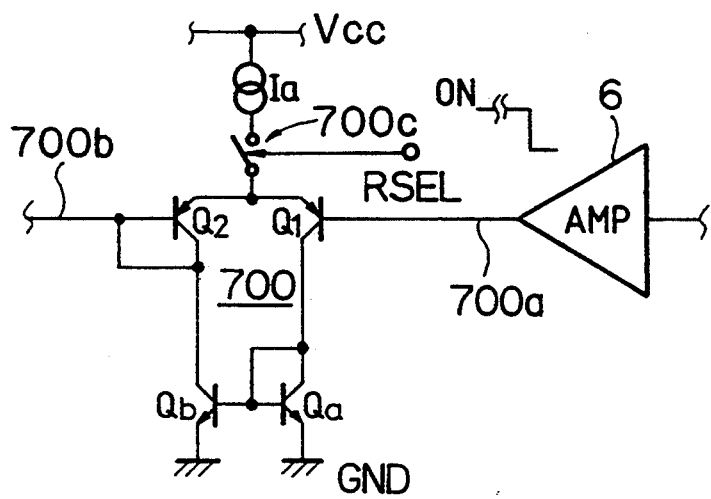
FIG. 2 is a concrete block circuit diagram of an "ON/OFF" switch circuit in a recording circuit shown in FIG. 1.

FIG. 2 shows a concrete example of the switch circuit 700. A pair of PNP differential transistors Q1 and Q2 have emitters commonly connected through the switch circuit 700 to the current source Ia and connected to the power source line Vcc. Collectors of the transistors Q1 and Q2 are grounded through loads which are NPN transistors Qa and Qb constituting an input and output sides of a current mirror circuit, respectively. An output is derived from the collector side of the transistor Q2. This collector is connected to a base of the transistor Q2 which is the (−) input side, by which the output signal is fully fedback to the (−) input. The base of the transistor Q1 receives an output of the recording amplifier 6 as the (+) input side.

In such circuit, when the recording setting signal RSEL becomes "H", the switch circuit 700 is turned "ON" to connect the current source Ia to the emitters of the transistors Q1 and Q2. The recording signal is output as it is with amplification factor of substantially 1 by this differential amplifier 700 with full feedback and sent to the head 9. On the other hand, when the recording setting signal RSEL becomes "L", the switch circuit 700 is turned "OFF", so that the current source Ia is separated from the emitters of the transistors Q1 and Q2 as shown.

By this, the emitters of the transistors Q1 and Q2 float up from the power source line Vcc. The collector and base of the transistor Q2 are connected together by the feedback path for feeding-back the output and to the ground line GND. Therefore, it becomes a forward diode and reverse-biases the base-emitter circuit of the transistor Q1. As a result, it serves as a reverse diode inserted between the base and emitter of the transistor Q1 with respect to the input signal.

With this connection, the input side of this differential amplifier is completely separated from the output side thereof, providing a switch circuit having high separability. It can block a signal such as recording signal whose level is as high as several volts.

As to the switch circuit 700c, it is not provided physically. That is, when the current source Ia is constructed with a single transistor, it is enough to supply the recording setting signal RSEL to its control electrode, that is, its base, as a pulse signal by which the transistor is made "ON" with a constant current and "OFF" by the base current "0". When this is "OFF", the operation of this transistor is stopped, so that a value of current from the current source which flows through the collector-emitter circuit of this transistor becomes substantially "0". Current flowing into the transistors Q1 and Q2 from the current source Ia is blocked by stopping the current of the current source in this manner.

Alternatively, it is possible to provide a circuit which is turned "ON" when the recording setting signal RSEL is received at its base, between the current source Ia and the emitters of the transistors Q1 and Q2 as the switch circuit 700c.

Figure 3:
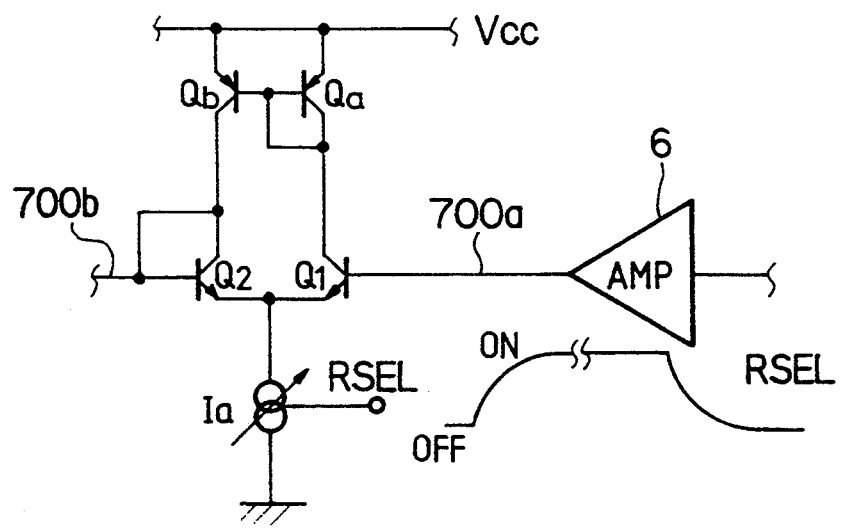
FIG. 3 is a concrete block circuit diagram capable of blocking pop sound in the recording circuit shown in FIG. 1.

FIG. 3 shows an embodiment in which, in order to prevent the pop "ON", the current value of the current source Ia is controlled directly to set it to "0" gradually or to a constant value gradually. In this embodiment, the current source Ia is inserted into the ground side and the differential transistors Q1 and Q2 are NPN transistors. Further, the recording setting signal RSEL is not "ON"/"OFF" pulse signal but a pulse signal having leading edge gradually rising with a certain time constant and trailing edge gradually falling similarly, as shown. This is applied to an electrode for controlling the current value of the current source Ia, for example, a base.

Figure 4:
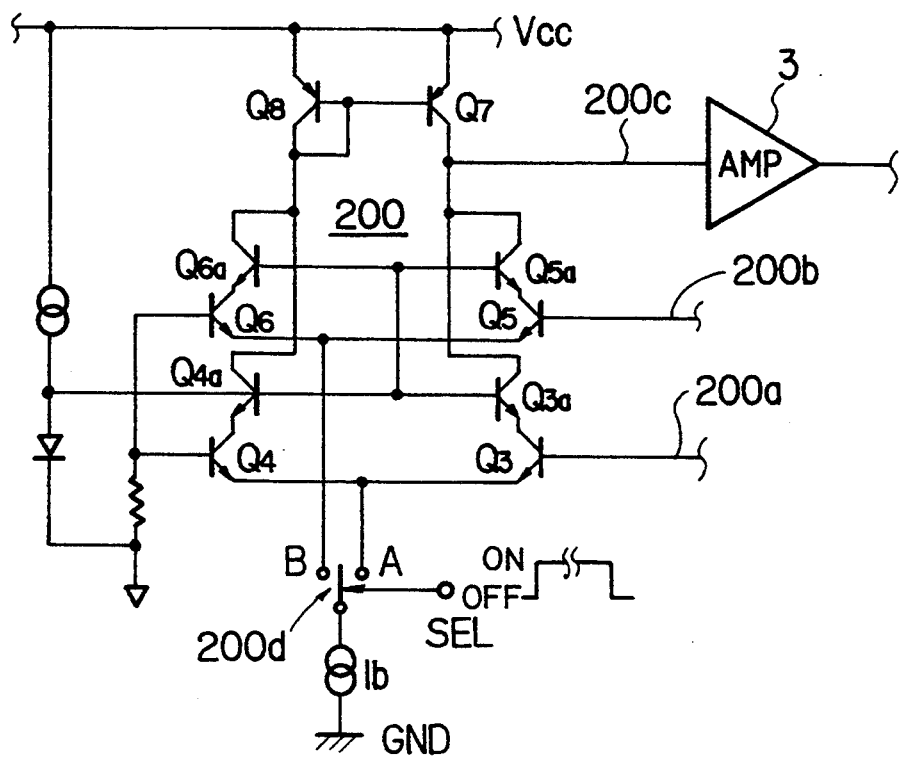
FIG. 4 is a concrete circuit diagram of a turn-over switch in a reproducing circuit shown in FIG. 1.

The switch circuit 200 includes a first pair of NPN differential transistors Q3 and Q4 and a second pair of NPN differential transistors Q5 and Q6, as shown in FIG. 4. The transistors Q3 and Q4 have emitters commonly connected to a selection input A of the switch circuit 200d and then through a current source Ib to the ground line GND. The differential transistors Q5 and Q6 have emitters commonly connected to a selection input B of a turn-over switch circuit 200d and then through a current source Ib to the ground line GND. An input side PNP transistor Q7 is connected to collectors of the transistors Q3 and Q5 as a common load and an output side PNP transistor Q8 is connected to collectors of the transistors Q4 and Q6 as a common load and the transistors Q7 and Q8 constitute a current mirror circuit. The power source line Vcc is connected to them through these loads. NPN transistors Q3a and Q4a connected to the respective transistors Q3 and Q4 and NPN transistors Q5a and Q6a connected to the respective transistors Q5 and Q6 are to reduce coupling capacitance between the respective base-collector circuits and may be omitted if necessary.

A reproducing signal 200a on the side of the head 9 is supplied to a base of the transistor Q3 and a reproducing signal 200b on the side of the head 1 is supplied to a base of the transistor Q5. An output signal 200c is derived from a collector side of the transistor Q7 and supplied to the reproducing amplifier 3.

The differential amplifier 200 is different from the differential amplifier 700 shown in FIG. 2 in that its output side is not fedback to the (−) input side. Although it can be fedback, the input signal can be sufficiently cut by merely cutting the current of the current sources without such feedback. The reason for that is that the input signal is the reproduced signal whose level is as low as several milli-voltages.

In such circuit, when the turn-over signal SEL becomes "H", the connection of the switch circuit 200d becomes an A side and the differential transistors Q3 and Q4 becomes operable to transmit the reproduced signal 200a to the transistor Q7, which is output to the reproducing amplifier 3 as the output signal 200c. When the turn-over signal SEL becomes "L", the connection of the switch circuit 200d becomes a B side and the differential transistors Q5 and Q6 becomes operable to transmit the reproduced signal 200b to the transistor Q7, which is output to the reproducing amplifier 3 as the output signal 200c.

As the switch circuit 200d, the so-called current switching circuit can be used in which emitters of two transistors are commonly connected to make their collector-emitter circuits as a switch circuit. And, it is enough that either of these transistors is turned "ON" in response to the switching signal SEL supplied to a base thereof and the other transistor is turned "OFF" thereby.

Figure 5:
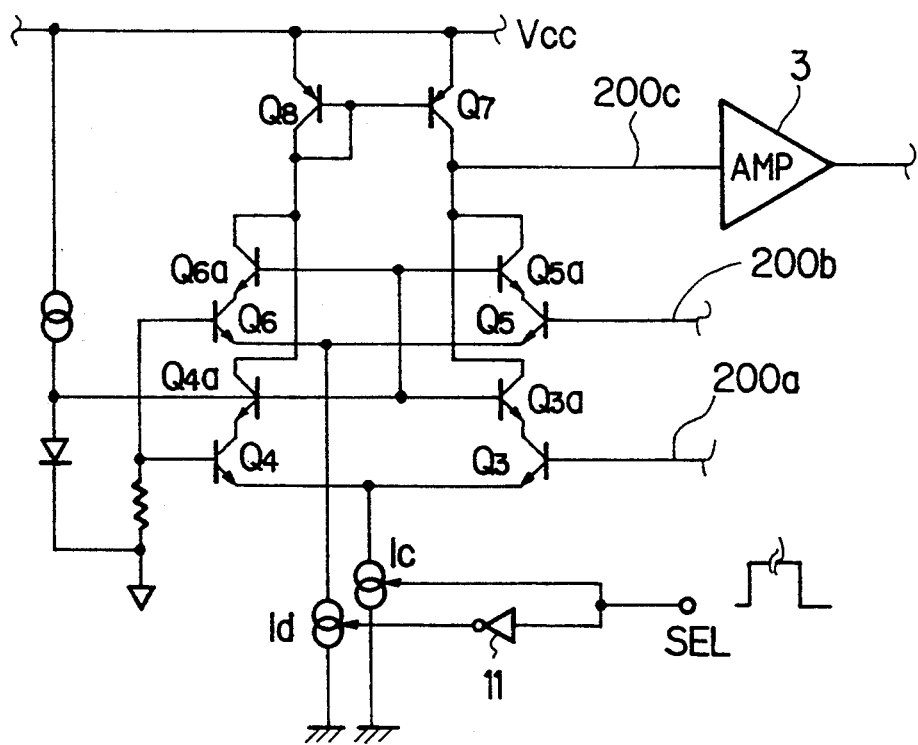
FIG. 5 is a concrete circuit diagram having no turn-over switch in FIG. 4.

FIG. 5 shows another embodiment which, instead of providing the current switching circuit, current sources Ic and Id are provided for the differential transistors Q3 and Q4 and the differential transistors Q5 and Q6, respectively. they stop to operate by selectively reducing a current value of one of the current sources Ic and Id to substantially "0" to thereby cut a current flowing from an emitter side of the differential amplifier to the current source. Incidentally, 11 is an inverter.

It is possible to prevent the pop sound, here, by using the switching signal SEL which is not a pulse signal but a pulse signal having gradually changing leading and trailing edges similarly to the recording setting signal RSEL shown in FIG. 3.

Although, in FIGS. 4 and 5, the differential amplifier of the switching circuit is formed by the NPN transistors, they may be PNP transistors. In such case, the current sources may be connected to the power source line.

Although it has been described with reference to the embodiments and although the switch circuit for making the recording signal "ON" is exemplified by the full feedback, it is not always necessary to fully feedback.

What is claimed is:

1. A recording/reproducing circuit comprising: a recording amplifier for outputting a recording signal; a differential amplifier including a pair of transistors, a base of one of said transistors being a (+) side input, a base of the other transistor being a (−) side input, emitters of said transistors being connected commonly to a current source, said (+) side input being supplied with said recording signal, an output signal being fedback to said (−) side input, said output signal being sent to a recording head;
   means for cutting a current of said current source to thereby stop an outputting of said recording signal from said differential amplifier circuit;
   wherein said recording amplifier and said differential amplifier circuit are formed as a single IC and said means is adapted to cut a current flowing between said commonly connected emitters and said current source during a reproducing period; and
   wherein said recording head is a recording/reproducing head and further comprising a reproducing amplifier, a reproducing head and a second switch circuit for selecting one of reproducing signals from said recording/reproducing head and said reproducing head and outputting the selected reproducing signal to said reproducing amplifier; said second switch circuit, said recording amplifier and said differential amplifier being formed as a single IC; said output of said differential amplifier and said recording/reproducing head being connected externally of said IC without a switch; and said reproducing head and said second switch circuit being connected externally of said IC without a switch.

2. The recording/reproducing circuit claimed in claim 1, wherein said second switch circuit comprises a first differential amplifier circuit supplied with a signal from said recording/reproducing head and a second differential amplifier circuit supplied with a signal from said reproducing head, said first and second differential amplifier circuits having a common load, a current value of a current source of said first differential amplifier circuit being controlled to substantially "0" to stop an operation of said first differential amplifier circuit so that said reproducing signal from said reproducing head is output to said reproducing amplifier by an operation of said second differential amplifier circuit and a current value of a current source of said second differential amplifier circuit being controlled to substantially "0" to stop an operation of said second differential amplifier circuit so that said reproducing signal from said recording/reproducing head is output to said reproducing amplifier by an operation of said first differential amplifier circuit.

3. The recording/reproducing circuit claimed in claim 2, wherein said current sources of said first and second differential amplifier circuits are a common current source being switch by a third switch circuit, said first and second differential amplifier circuits being operable and inoperable, respectively, by connecting said common current source to said first differential amplifier circuit and said first and second differential amplifier circuits being inoperable and operable, respectively, by connecting said common current source to said second differential amplifier circuit.

4. The recording/reproducing circuit claimed in claim 1, further comprising a first switch circuit connected between said commonly connected emitters of said transistor pair and said current source and wherein said output signal of said differential amplifier circuit is fully fedback to said (−) input side and said means is adapted to make said first switch circuit "OFF" during the reproducing period and "ON" during a recording period.

5. The recording/reproducing circuit claimed in claim 1, wherein said output signal is fully fedback to said (−) input side and said means controls a current of said current source to make it substantially "0" during the reproducing period and to make it a predetermined value during the recording period.

6. A recording/reproducing apparatus comprising: a recording/reproducing head; a recording amplifier for outputting a recording signal to said recording/reproducing head; a first switch circuit provided between an output of said recording amplifier and said recording/reproducing head; a reproducing head; a reproducing amplifier; and a second switch circuit;
   wherein said first switch circuit includes a first differential amplifier circuit including a pair of transistors, a base of one of said transistors being a (+) side input, a base of the other transistor being a (−) side input, emitters of said transistors being connected commonly to a current source, said (+) side input being supplied with said recording signal, an output signal being fedback to said (−) side input, said output signal being sent to a recording head, a current of said current source being cut during a reproducing period and being set to a predetermined value during a recording period;
   wherein said second switch circuit comprises a second differential amplifier circuit supplied with a signal from said recording/reproducing head and a third differential amplifier circuit supplied with a signal from said reproducing head, said second and third differential amplifier circuits having a common load, a current value of a current source of said second differential amplifier circuit being controlled to substantially "0" to stop an operation of said second differential amplifier circuit so that said reproducing signal from said reproducing head is output to said reproducing amplifier by an operation of said third differential amplifier circuit and a current value of a current source of said third differential amplifier circuit being controlled to substantially "0" to stop an operation of said third differential amplifier circuit so that said reproducing signal from said recording/reproducing head is output to said reproducing amplifier by an operation of said second differential amplifier circuit;

wherein said recording amplifier, said reproducing amplifier and said first and second switch circuits are formed as a single IC and said output of said first differential amplifier and said recording/reproducing head being connected externally of said IC without a switch and said reproducing head and said second switch circuit being connected externally of said IC without a switch.

7. The recording/reproducing apparatus claimed in claim 6, wherein said current sources of said second and third differential amplifier circuits are provided as a single current source selectably connected thereto through a switch circuit, said second and third differential amplifier circuits are made operable and inoperable, respectively, by connecting said common current source to said second differential amplifier circuit and said second and third differential amplifier circuits being inoperable and operable, respectively, by connecting said common current source to said third differential amplifier circuit.

* * * * *